United States Patent
Pan

(10) Patent No.: US 7,474,880 B2
(45) Date of Patent: Jan. 6, 2009

(54) LINEAR AND NON-LINEAR DUAL MODE TRANSMITTER

(75) Inventor: Meng-An Pan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 486 days.

(21) Appl. No.: 11/087,704

(22) Filed: Mar. 24, 2005

(65) Prior Publication Data

US 2006/0217090 A1 Sep. 28, 2006

(51) Int. Cl.
*H01Q 11/12* (2006.01)
*H04B 1/02* (2006.01)

(52) U.S. Cl. .................................. 455/127.1; 330/136

(58) Field of Classification Search .............. 455/127.1, 455/127.2, 127.4; 330/136, 285; 375/297
See application file for complete search history.

(56) References Cited

U.S. PATENT DOCUMENTS

| | | | |
|---|---|---|---|
| 3,739,292 | A | 6/1973 | Furuhashi |
| 5,565,813 | A | 10/1996 | Connell et al. |
| 6,774,717 | B2 | 8/2004 | Hellberg |
| 6,831,511 | B2 | 12/2004 | Hollingsworth et al. |
| 7,031,668 | B2 | 4/2006 | Darabi et al. |
| 7,120,411 | B2 | 10/2006 | Darabi |
| 7,183,858 | B2 | 2/2007 | Pan |
| 7,184,735 | B2 | 2/2007 | Bhatti et al. |
| 2002/0175763 | A1 | 11/2002 | Dasgupta et al. |
| 2002/0180522 | A1* | 12/2002 | Duperray ..................... 330/136 |
| 2002/0186079 | A1 | 12/2002 | Kobayashi |
| 2003/0011434 | A1 | 1/2003 | Luo et al. |
| 2004/0150473 | A1 | 8/2004 | Hollingsworth et al. |
| 2004/0229579 | A1* | 11/2004 | Tsutsui et al. ............ 455/127.2 |
| 2005/0012547 | A1 | 1/2005 | Kwon et al. |
| 2005/0135502 | A1* | 6/2005 | Zhang et al. ................. 375/297 |
| 2005/0287964 | A1 | 12/2005 | Tanaki et al. |
| 2006/0052071 | A1 | 3/2006 | Pan |
| 2006/0178165 | A1 | 8/2006 | Vassiliou et al. |
| 2006/0255857 | A1 | 11/2006 | Parker et al. |
| 2007/0270111 | A1 | 11/2007 | Pan |

\* cited by examiner

*Primary Examiner*—Lee Nguyen
(74) *Attorney, Agent, or Firm*—Sterne, Kessler, Goldstein & Fox, P.L.L.C.

(57) ABSTRACT

A transmitter includes a dual mode modulator and an amplifier coupled to the dual mode modulator. The dual mode modulator implements a linear modulation scheme during a first mode of the modulator to produce a variable envelope modulated signal. The dual mode modulator implements a non-linear modulation scheme during a second mode of the modulator to produce a constant envelope modulated signal. The amplifier is biased as a linear amplifier during the first mode of the modulator and is biased as a non-linear amplifier during the second mode of the modulator. A feed-forward connection between the dual mode modulator and the amplifier is used to indicate a change in modulation mode and to adjust the bias of the amplifier. A power of the constant envelope modulated signal is increased such that an operating point of the amplifier remains substantially constant during the first and second modes of the modulator.

18 Claims, 11 Drawing Sheets

LINEAR AND NON-LINEAR DUAL MODE TRANSMITTER

BACKGROUND OF THE INVENTION

1. Field of the Invention

The present invention generally relates to dual mode transmitters. More specifically, the present invention provides a dual mode transmitter having an adjustable power amplifier to provide both linear and non-linear amplification.

2. Background Art

A dual mode transmitter is capable of implementing linear modulation schemes and non-linear modulation schemes and transmitting signals generated therefrom. A linear modulation scheme typically produces a variable envelope signal. A non-linear modulation scheme typically produces a constant envelope signal. A variable envelope signal requires linear amplification to prevent distortion of information encoded in the amplitude of the variable envelope signal. A constant envelope signal does not require linear amplification since the amplitude of a constant envelope signal does not contain information. Constant envelope signals can therefore tolerate distortion from non-linear amplification provided the zero-crossings of the constant envelope signal are preserved.

Dual mode transmitters typically use a single power amplifier to amplify modulated signals prior to transmission. A power amplifier requires a relatively high bias voltage to provide linear amplification. A power amplifier, however, does not require a relatively high bias voltage to provide non-linear amplification. Therefore, using a linear power amplifier to amplify a constant envelope signal decreases efficiency since unneeded power is consumed. Alternatively, using a non-linear power amplifier to amplify a variable envelope signal causes intolerable distortion. Further, using multiple power amplifiers to accommodate different modes of modulation wastes space and increases operating costs and integration costs when the dual mode transmitter is implemented on a single semiconductor chip.

BRIEF SUMMARY OF THE INVENTION

Accordingly, the present invention is directed to a dual mode transmitter having a power amplifier with an adjustable bias. The bias of the power amplifier is tuned to provide linear amplification during linear modes of modulation and to provide non-linear amplification during non-linear modes of modulation while maintaining a constant output power.

In one aspect, there is provided a transmitter that includes a dual mode modulator and an amplifier coupled to the dual mode modulator. The dual mode modulator implements a linear modulation scheme during a first mode of the modulator to produce a variable envelope modulated signal. The dual mode modulator implements a non-linear modulation scheme during a second mode of the modulator to produce a constant envelope modulated signal. The amplifier is biased as a linear amplifier during the first mode of the dual mode modulator and is biased as a non-linear amplifier during the second mode of the dual mode modulator. A feed-forward connection between the dual mode modulator and the amplifier is used to indicate a change in modulation mode and to adjust the bias of the amplifier. A power of the constant envelope modulated signal is increased such that an operating point (i.e., the transmitted output power) of the amplifier remains substantially constant during the first and second modes of the dual mode modulator.

In another aspect, there is provided a method for adjusting the operation of a power amplifier in response to a change in modulation scheme implemented by a dual mode modulator. A dual mode modulator receives a data signal from an information source. A modulation mode of the dual mode transmitter is determined. The data signal is modulated according to the determined mode of modulation to produce a modulated signal. An amplifier is biased according to the mode of modulation and amplifies the modulated signal to produce an amplified modulated signal. The amplifier is biased as a linear amplifier during a linear modulation mode and is biased as a non-linear amplifier during a non-linear modulation mode. A power of the modulated signal is increased during the non-linear modulation mode so that an operating point of the amplifier remains substantially constant during linear and non-linear modulation modes. A feed-forward connection between the dual mode modulator and the amplifier provides an indication to the amplifier of a change in modulation mode. The feed-forward connection adjusts the biasing of the amplifier.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF DRAWINGS/FIGURES

The accompanying drawings illustrate the present invention and, together with the description, further serve to explain the principles of the invention and to enable one skilled in the pertinent art to make and use the invention.

Figure 11:
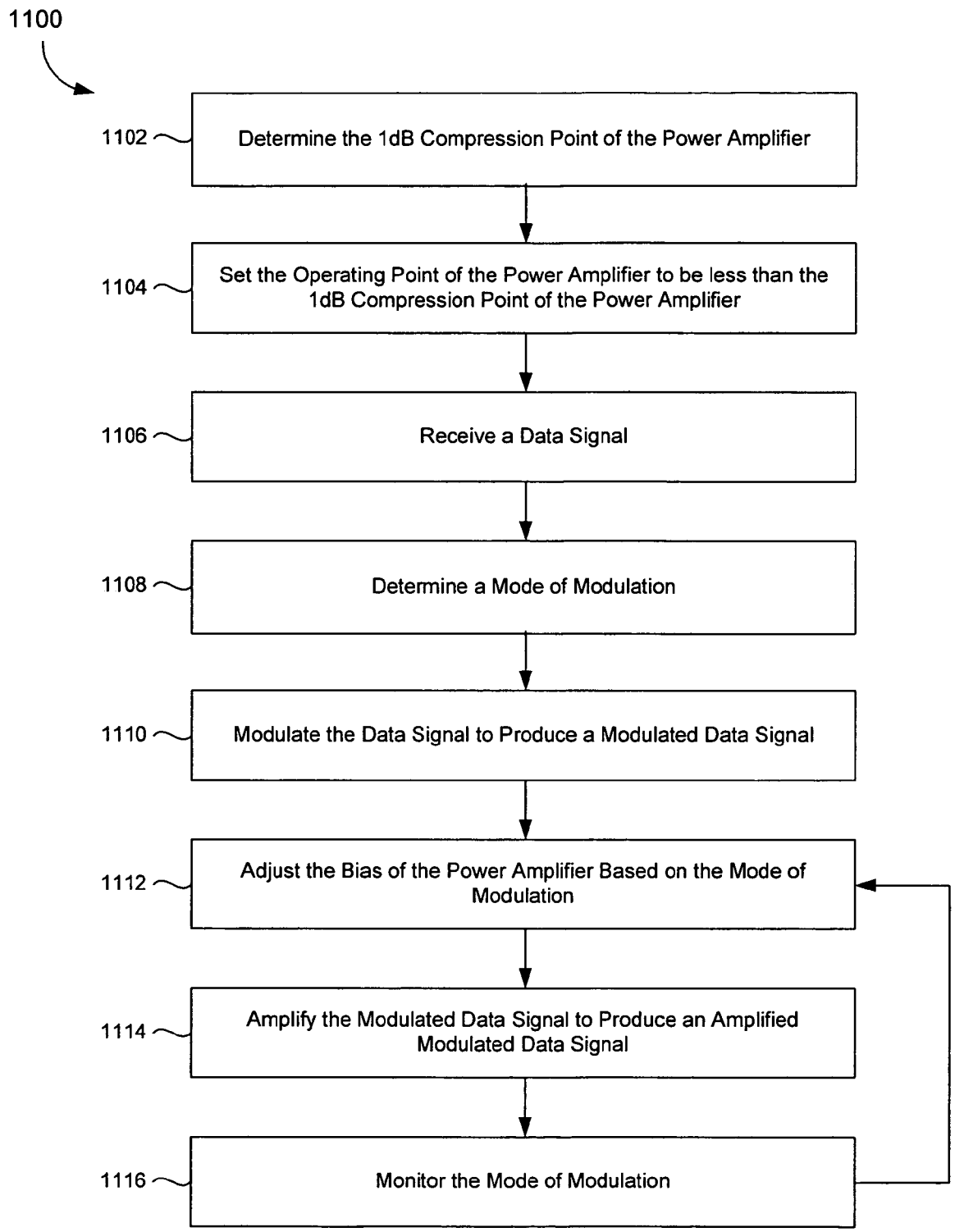

FIG. 11 provides a flowchart that illustrates operational steps for adjusting the operation of the power amplifier of the present invention in response to a change in modulation scheme according to the present invention.

DETAILED DESCRIPTION OF THE INVENTION

Figure 1:
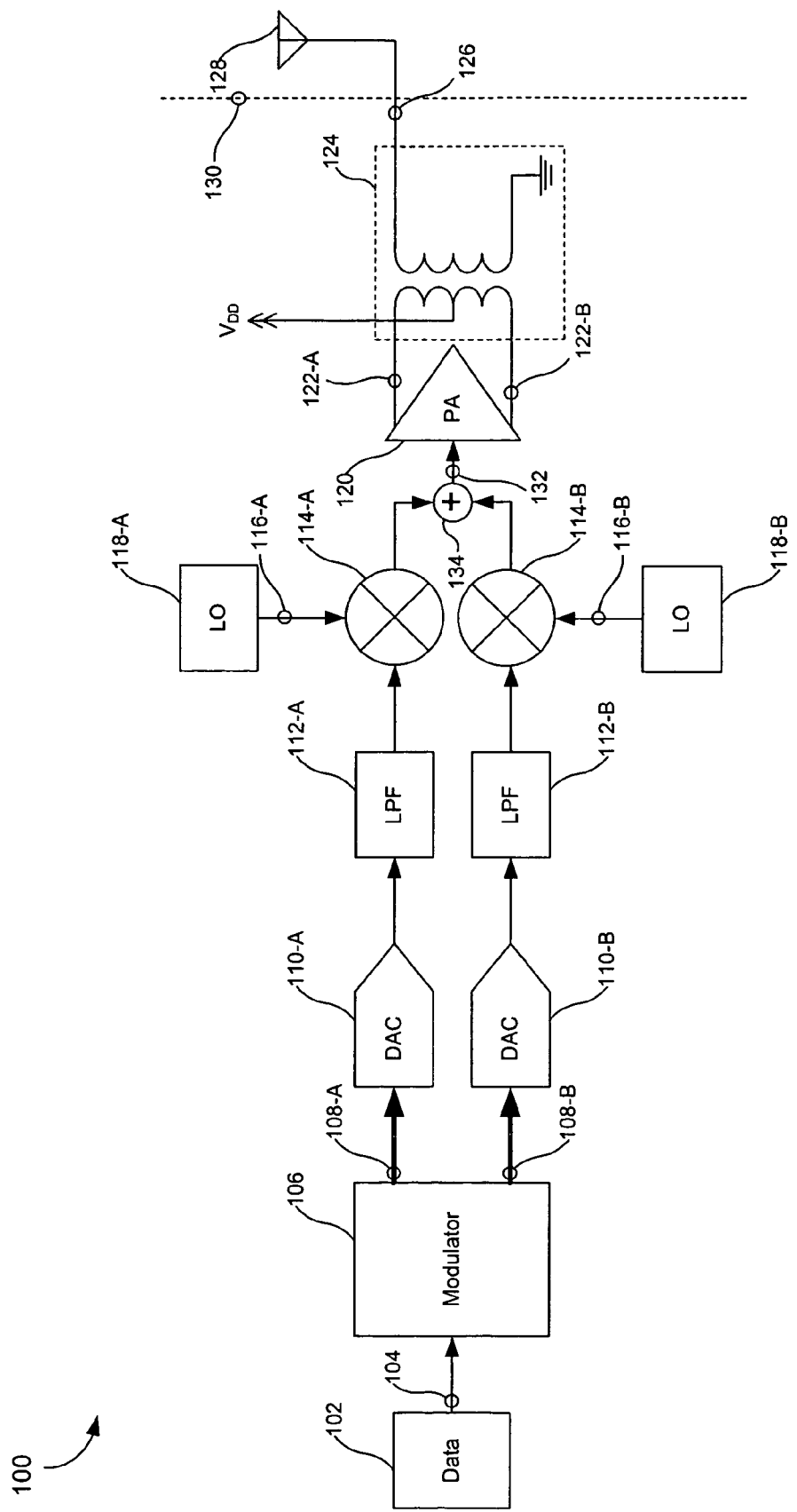
FIG. 1 illustrates a conventional wireless transmitter having a conventional power amplifier.

FIG. 1 illustrates a conventional wireless transmitter 100. The conventional wireless transmitter 100 includes an information source 102. The information source 102 generates a data signal 104. The data signal 104 is a sequence of bits. The information source 102 provides the data signal 104 to a conventional modulator 106. The conventional modulator 106 encodes and modulates the data signal 104 and provides two modulation channels (e.g., an in-phase channel and a quadrature-phase channel). Specifically, the conventional modulator 106 generates a modulated data signal 108-A and an associated modulated data signal 108-B. The modulated data signals 108-A and 108-B can be baseband signals or can be signals centered at an intermediate frequency (IF). The modulated data signals 108-A and 108-B are multiple-bit digital signals.

As illustrated in FIG. 1, the modulated data signals 108-A and 108-B are provided to digital-to-analog converters (DACs) 110-A and 110-B and to low-pass filters (LPFs) 112-A and 112-B, respectively. The DAC 110-A converts the modulated data signal 108-A from a digital signal into a differential analog signal. The LPF 112-A isolates an appropriate portion of the modulated data signal 108-A for transmission. Similarly, the DAC 110-B converts the modulated data signal 108-B from a digital signal to a differential analog signal and the LPF 112-B isolates an appropriate portion of the modulated data signal 108-B for transmission.

The conventional wireless transmitter 100 further includes a pair of mixers 114-A and 114-B. The mixer 114-A receives a carrier signal 116-A from a local oscillator (LO) 118-A. The carrier signal 116-A is typically a relatively high frequency sinusoidal waveform. The mixer 114-A up-converts the modulated data signal 108-A to a frequency of the carrier signal 116-A. Specifically, the mixer 114-A receives the modulated data signal 108-A as a differential analog signal and produces a frequency-translated version of the modulated data signal 108-A that is also a differential analog signal.

Similarly, the mixer 114-B receives a carrier signal 116-B from an LO 118-B. The carrier signal 116-B is also typically a relatively high frequency sinusoidal waveform and is used to up-convert the modulated data signal 108-B to a frequency of the carrier signal 116-B. The mixer 114-B receives the modulated data signal 108-B as a differential analog signal and produces a frequency-translated version of the modulated data signal 108-B that is also a differential analog signal. Typically, the modulated data signals 108-A and 108-B are up-converted to a radio frequency (RF) by the mixers 114-A and 114-B, respectively.

As further illustrated in FIG. 1, the mixers 114-A and 114-B are coupled to an adder 134. The adder 134 sums corresponding differential components of the differential analog signals produced by the mixers 114-A and 114-B. In this way, the adder 134 produces a differential up-converted modulated signal 132.

The adder 134 is coupled to a conventional power amplifier 120. The conventional power amplifier 120 amplifies the differential up-converted modulated signal 132 to produce a differential amplified modulated data signal 122 (shown in FIG. 1 as amplified modulated data signals 122-A and 122-B). The conventional power amplifier 120 provides the amplified modulated data signals 122-A and 122-B to the primary winding of a transformer 124. The primary winding of the transformer 124 has two taps for receiving the amplified modulated data signals 122-A and 122-B. A middle primary winding tap is coupled to a power supply VDD. The secondary winding of the transformer 124 has two taps. A first secondary winding tap is coupled to an antenna 128. A second secondary winding tap is coupled to a ground. The transformer 124 converts the differential output of the conventional power amplifier 120 (i.e., the amplified modulated data signals 122-A and 122-B) into a single-ended output signal 126.

The single-ended output signal 126 is provided to the antenna 128 for wireless transmission. As indicated by a chip boundary 130, the conventional wireless transmitter 100 resides entirely on a single semiconductor chip. That is, only the antenna 128 is located "off-chip" since every other element of the conventional wireless transmitter 100 is located "on-chip."

The conventional wireless transmitter 100 is adapted to provide various types of modulated data signals 108-A and 108-B by implementing a variety of modulation schemes with the conventional modulator 106. Further, the conventional wireless transmitter 100 is adapted to up-convert the modulated data signals 108-A and 108-B onto a variety of transmission channel bandwidths by altering the LPFs 112-A and 112-B and the carrier signals 116-A and 116-B. Overall, the conventional wireless transmitter 100 can be modified to provide a single-ended output signal 126 that conforms to a variety of communication protocols, standards, or known schemes.

The conventional wireless transmitter 100, for example, can be implemented as a Bluetooth® transmitter. To do so, the conventional wireless transmitter 100 up-converts the modulated data signals 108-A and 108-B onto a 1 MHz channel between 2402 to 2480 MHz, in accordance with the Bluetooth® standard. Further, the conventional modulator 106 is implemented as a dual mode modulator. That is, the conventional modulator 106 is capable of implementing modulations schemes that produce constant envelope signals and modulation schemes that produce non-constant, or variable envelope signals. Various linear modulation schemes produce variable envelope signals while non-linear modulation schemes typically produce constant envelope signals. Therefore, a dual mode transmitter may be able to implement a variety of linear modulation schemes and a variety of non-linear modulation schemes.

The conventional modulator 106, when implemented according to the Bluetooth® protocol, provides three modes of modulation. A first mode of modulation is Gaussian Frequency-Shift Keying (GFSK). Under the Bluetooth® standard, GFSK modulation provides a single-ended output signal 126 that has a constant envelope and a data rate of 1 Megabits per second (Mb/s) with a symbol rate of 1 Megasymbols per second (Msym/s). A second mode of modulation specified by the Bluetooth® protocol is π4/-Differential Quadrature Phase-Shift Keying (π4/-DQPSK). π4/-DQPSK modulation provides a single-ended output signal 126 that has a variable envelope and a data rate of 2 Mb/s with a symbol rate of 1 Msym/s. A third mode of modulation possible with the Bluetooth® standard is 8-ary Differential Phase-Shift Keying (8-DPSK). 8-DPSK modulation provides a single-ended output signal 126 that has a variable envelope and a data rate of 3 Mb/s with a symbol rate of 1 Msym/s.

π4/-DQPSK modulation encodes information (i.e., bits) in both amplitude and phase and is considered a linear modulation scheme that requires linear amplification. Therefore, a π4/-DQPSK modulated signal should not be distorted when amplified prior to transmission since the variable envelope of a π4/-DQPSK modulated signal contains information.

8-DPSK modulation also encodes information in both amplitude and phase. 8-DPSK modulation is also considered a linear modulation scheme that requires linear amplification since the variable envelope of an 8-DPSK modulated signal contains information. Consequently, the conventional power amplifier 120 should provide linear amplification when the conventional modulator 106 is implementing the π/4-DQPSK or 8-DPSK modulation schemes specified by the Bluetooth® standard. More broadly, the conventional power amplifier 120 should prevent or minimize the distortion of encoded information by providing linear amplification when the conventional modulator 106 implements any linear modulation scheme that encodes information within the envelopes of the modulated data signals 108-A and 108-B.

GFSK modulation encodes information in frequency and is considered a non-linear modulation scheme. Information is not contained within the constant envelope of a GFSK modulated signal. Therefore, a GFSK modulated signal can tolerate envelope distortion during amplification and so does not require linear amplification. A GFSK modulated signal can tolerate envelope distortion during amplification since the zero-crossings (i.e., the frequency information) of a GFSK modulated signal are preserved during non-linear amplification. Therefore, the conventional power amplifier 120 does not need to provide linear amplification when the conventional modulator 106 is implementing the GFSK modulation scheme according to the Bluetooth® standard. More broadly, the conventional power amplifier 120 does not need to be a linear amplifier when the conventional modulator 106 implements any non-linear modulation scheme that does not encode information within the envelopes of the modulated data signals 108-A and 108-B.

Figure 2:
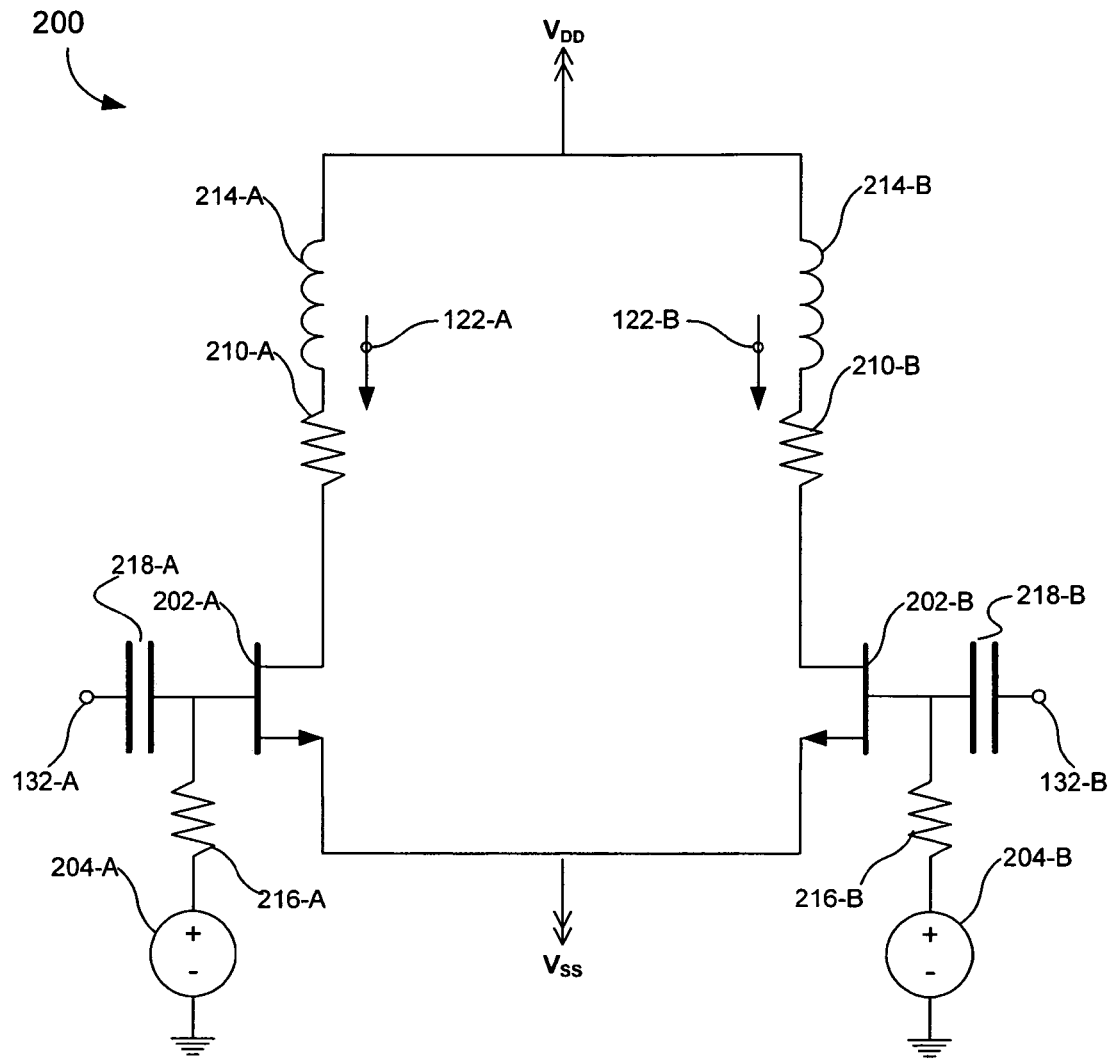
FIG. 2 illustrates a conventional differential amplifier used to implement the conventional power amplifier depicted in FIG. 1.

FIG. 2 illustrates a conventional differential amplifier 200 used to implement the conventional power amplifier 120. The conventional differential amplifier 200 includes a pair of transistors 202-A and 202-B. The pair of transistors 202-A and 202-B are each Field-Effect Transistors (FETs). The sources of the FETs 202-A and 202-B are connected together and coupled to a voltage supply $V_{SS}$. $V_{SS}$ typically provides a relatively low or negative voltage or, alternatively, is a ground.

The gates of the FETs 202-A and 202-B are AC coupled to up-converted modulated signals 132-A and 132-B through capacitors 218-A and 218-B, respectively. The gates of the FETs 202-A and 202-B are DC coupled to constant voltage sources 204-A and 204-B through bias resistors 216-A and 216-B, respectively. The constant voltage sources 204-A and 204-B, in conjunction with the bias resistors 216-A and 216-B, are used to bias the FETs 202-A and 202-B by applying a desired gate-source voltage to the FETs 202-A and 202-B.

As further shown in FIG. 2, the drains of the FETs 202-A and 202-B are coupled to resistors 210-A and 210-B and to inductors 214-A and 214-B, respectively. The inductors 214-A and 214-B model an inductance of the transformer 124 depicted in FIG. 1. The resistors 210-A and 210-B represent the parasitic resistance of the transformer 124. The drains of the FETs 202-A and 202-B are also coupled to the voltage supply $V_{DD}$. As previously mentioned, $V_{DD}$ is provided by a middle tap on the primary side of the transformer 124.

The conventional differential amplifier 200 is configured as a voltage controlled current source. In effect, the conventional differential amplifier 200 behaves as a transconductance device by converting an input voltage signal into an output current signal. Specifically, the conventional differential amplifier 200 receives the up-converted modulated signals 132-A and 132-B as a differential voltage signal pair (i.e., $V_{gs,A}$ and $V_{gs,B}$) and produces the amplified modulated data signals 122-A and 122-B as a differential current signal pair (i.e., $I_{d,A}$ and $I_{d,B}$). The amplified modulated data signals 122-A and 122-B, as differential current signals, are applied to the load of the antenna 128 and converted back to differential voltage signals.

The conventional differential amplifier 200 can be implemented as a linear amplifier or as a non-linear amplifier. The biasing condition of the conventional differential amplifier 200 primarily determines whether the conventional differential amplifier 200 will operate as a linear or non-linear amplifier. Specifically, the gate-source bias voltages applied to the FETs 202-A and 202-B by the constant voltage sources 204-A and 204-B determines whether the up-converted modulated signals 132-A and 132-B are amplified in a linear manner or a non-linear manner.

Figure 3:
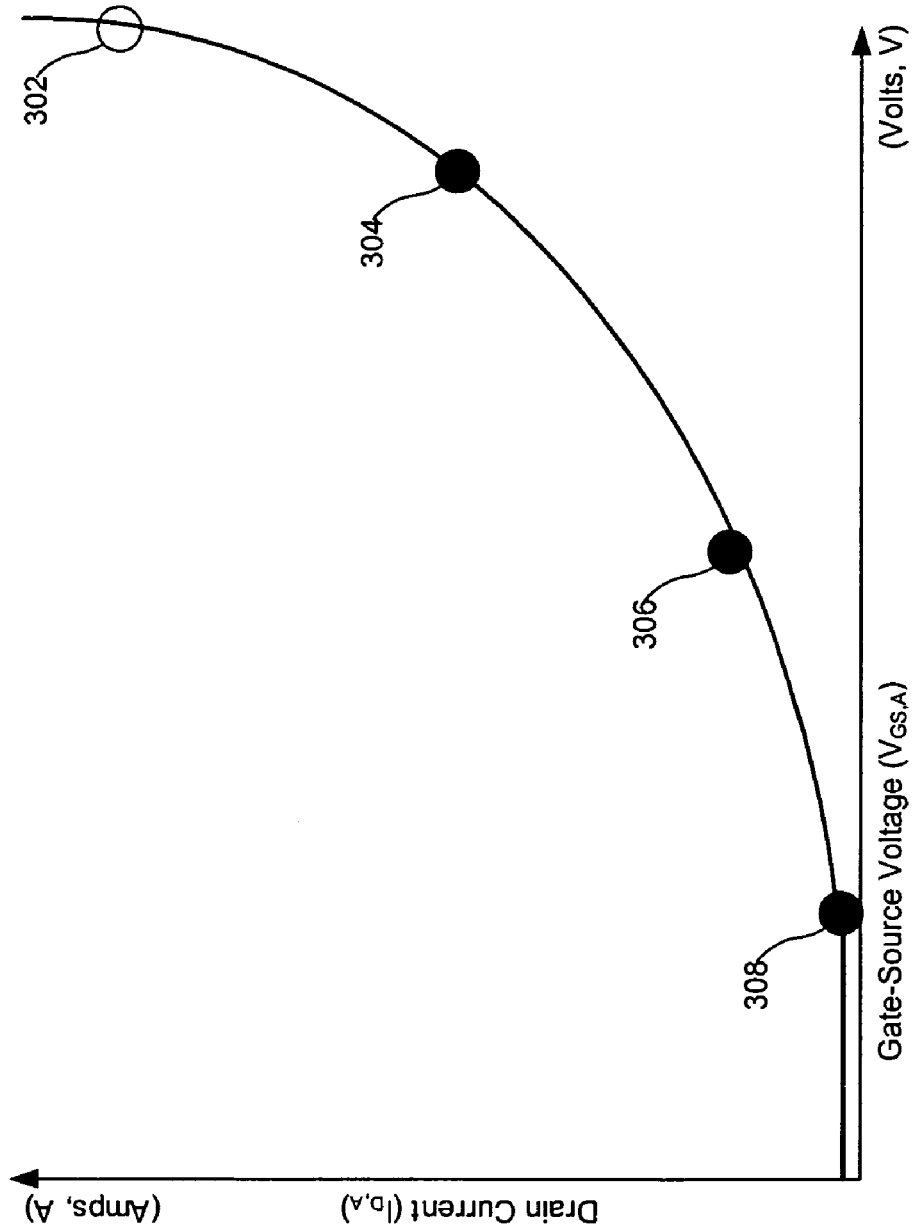
FIG. 3 illustrates possible biasing scenarios for the conventional differential amplifier depicted in FIG. 2.

FIG. 3 illustrates several possible biasing scenarios for the conventional differential amplifier 200. FIG. 3 depicts the relationship between the gate-source voltage of the FET 202-A ($V_{GS,A}$) shown in FIG. 2 and the drain current of the FET 202-A ($I_{D,A}$). The relationship between the gate-source voltage of the FET 202-B ($V_{GS,B}$) shown in FIG. 2 and the drain current of the FET 202-B ($I_{D,B}$) is identical to the relationship illustrated in FIG. 3 for the FET 202-A. The relationship between the gate-source voltage and the drain current is shown by a curve 302. The FET 202-A can be biased at any point on the curve 302 so as to behave as a voltage controlled current source. The drain current of the FET 202-A increases as the gate-source voltage of the FET 202-A is increased. In turn, the gain of the conventional power amplifier 120 (shown in FIG. 1) increases.

Figure 4:
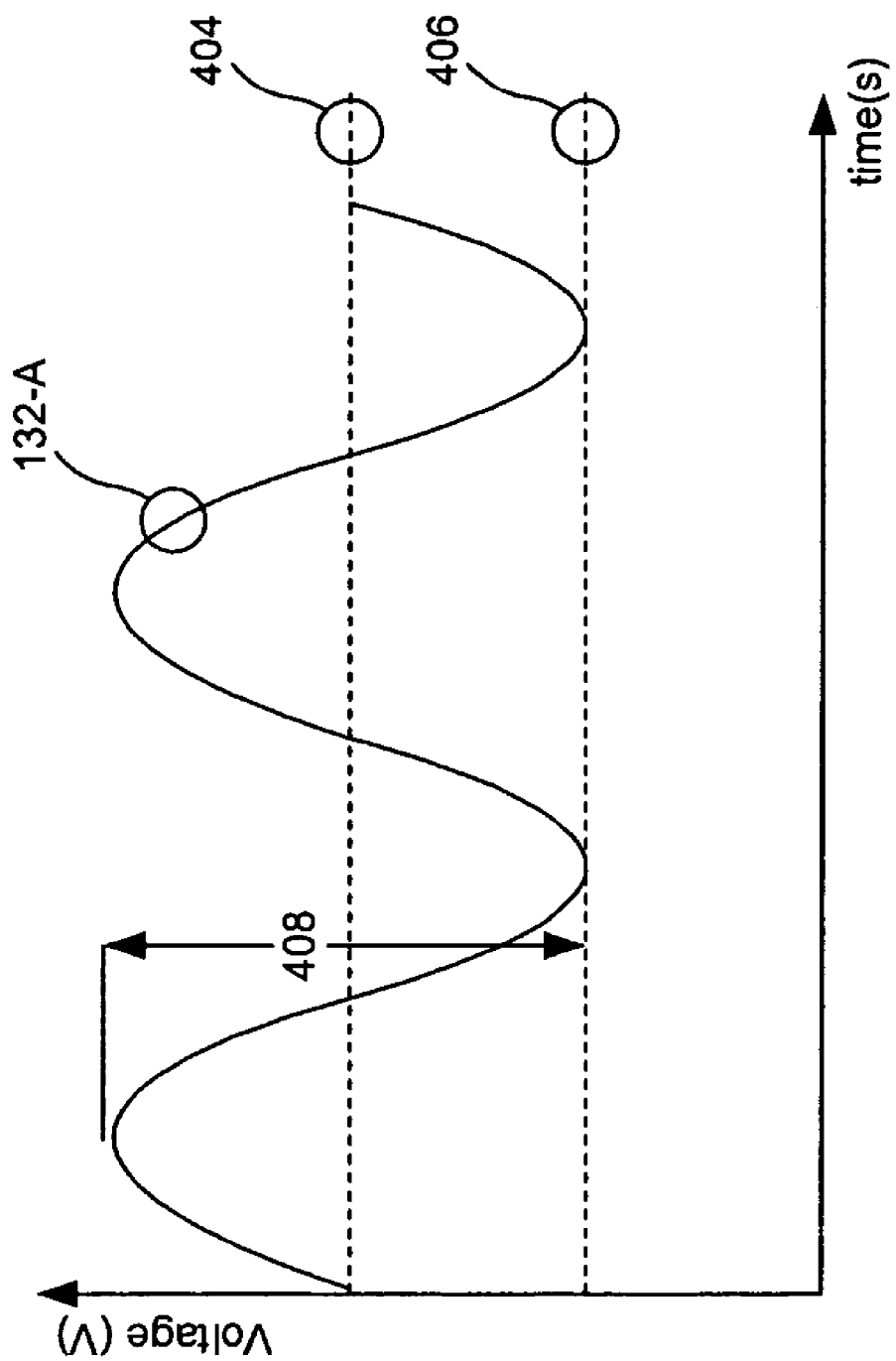
FIG. 4 illustrates the operation of the conventional differential amplifier depicted in FIG. 2 when biased at a first bias point depicted in FIG. 3.

At a bias point 304 on the curve 302, the FET 202-A is biased at a high gate-source voltage, relative to the threshold voltage ($V_{TH}$) of the FET 202-A. Specifically, the FET 202-A is biased with a gate-source voltage that can accommodate the full peak-to-peak voltage swing of the up-converted modulated signal 132-A. FIG. 4 illustrates the behavior of the FET 202-A when biased at a gate-source bias voltage 404 corresponding to the bias point 304. As shown in FIG. 4, the gate-source bias voltage 404 is much higher than a threshold voltage 406 of the FET 202-A. An entire peak-to-peak voltage swing 408 of the up-converted modulated signal 132-A is accommodated by the gate-source bias voltage 404. That is, the up-converted modulated signal 132-A does not swing below the threshold voltage 406 of the FET 202-A. The FET 202-A therefore remains in saturation for the complete cycle of the up-converted modulated signal 132-A. Consequently, the FET 202-A amplifies the up-converted modulated signal 132-A to produce the amplified modulated data signal 122-A (not shown in FIG. 4) without distortion.

The conventional power amplifier 200 is considered to be a Class A amplifier when operated at the bias point 304. Power amplifiers are categorized into operating classes based on biasing conditions. More specifically, power amplifiers are categorized into classes based on the number of degrees an output current flows relative to the full cycle (360°) of a given input signal. A Class A amplifier is characterized as being biased so that an output current continuously flows through the entire cycle of the given input signal. As shown in FIG. 4, the up-converted modulated signal 132-A does not dip below the threshold voltage 406 of the conventional differential amplifier 200 (not shown in FIG. 4). Because the voltage of the up-converted modulated signal 132-A is always greater than the threshold voltage 406, the FET 202-A does not turn off during any portion of the full cycle of the up-converted modulated signal 132-A. In turn, a drain current of the FET 202-A continuously flows during the complete cycle of the up-converted modulated signal 132-A. As with other Class A amplifiers, the conventional power amplifier 200, when operated at the bias point 304, displays high linearity.

Figure 5:
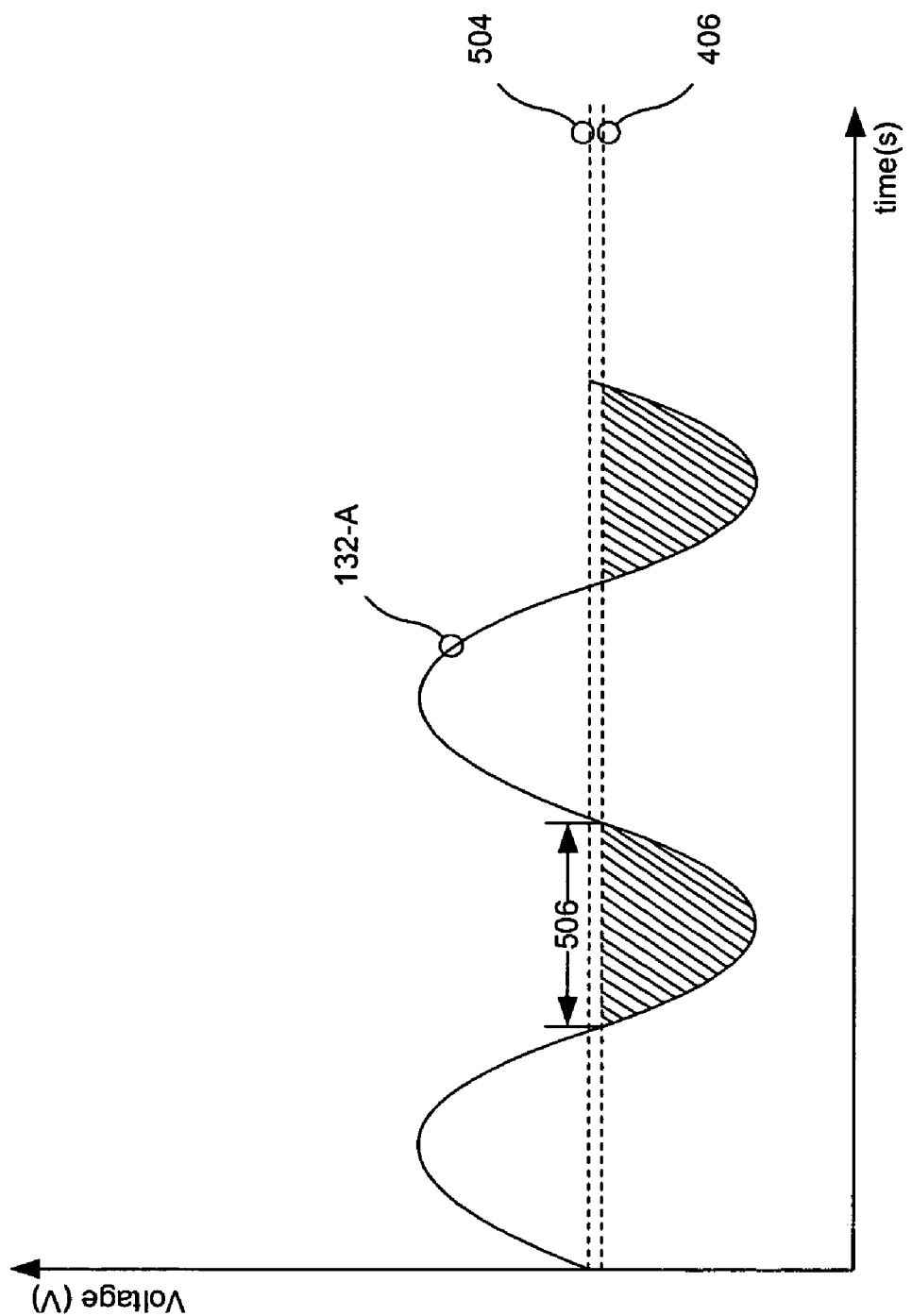
FIG. 5 illustrates the operation of the conventional differential amplifier depicted in FIG. 2 when biased at a second bias point depicted in FIG. 3.

At a bias point 308 on the curve 302, the FET 202-A is biased at a gate-source voltage that is approximately equal to the threshold voltage of the FET 202-A. Specifically, the FET 202-A is not biased with a gate-source voltage that can accommodate the full peak-to-peak voltage swing of the up-converted modulated signal 132-A. FIG. 5 illustrates the behavior of the FET 202-A when biased at a gate-source bias voltage 504 corresponding to the bias point 308. As shown in FIG. 5, the gate-source bias voltage 504 is approximately equal to the threshold voltage 406 of the FET 202-A. As a result, the up-converted modulated signal 132-A swings below the threshold voltage 406 of the FET 202-A during a portion of the complete cycle of the up-converted modulated signal 132-A. The FET 202-A is turned off when the up-converted modulated signal 132-A swings below the threshold voltage 406 of the FET 202-A. Specifically, the FET 202-A is turned off during a time 506 of the cycle of the up-converted modulated signal 132-A.

Turning off the FET 202-A during the time 506 causes the amplified modulated data signal 122-A to "clip," thereby distorting the amplified modulated data signal 122-A. Consequently, the amplified modulated data signal 122-A will comprise a main tone at the frequency of the up-converted modulated signal 132-A and harmonics. The power of the main tone of the amplified modulated data signal 122-A will be attenuated due to the distortion or clipping. Overall, biasing the FET 202-A at the bias point 308 causes the conventional power amplifier 120 to produce a distorted amplified modulated data signal 122-A.

The conventional power amplifier 200 is considered to be a Class B amplifier when operated at the bias point 308. A Class B amplifier is characterized as being biased so that an output current flows through approximately one-half of the entire cycle of an input signal. As shown in FIG. 5, the up-converted modulated signal 132-A dips below the threshold voltage 406 of the conventional differential amplifier 200 for approximately one-half of the cycle of the up-converted modulated signal 132-A. When the voltage of the up-converted modulated signal 132-A is lower than the threshold voltage 406, the FET 202-A is cut off. In turn, the drain current of the FET 202-A stops flowing. The conventional power amplifier 200, when operated at the bias point 308, distorts the envelope of the amplified modulated data signal 122-A but preserves the zero-crossings of the amplified modulated data signal 122-A.

Figure 6:
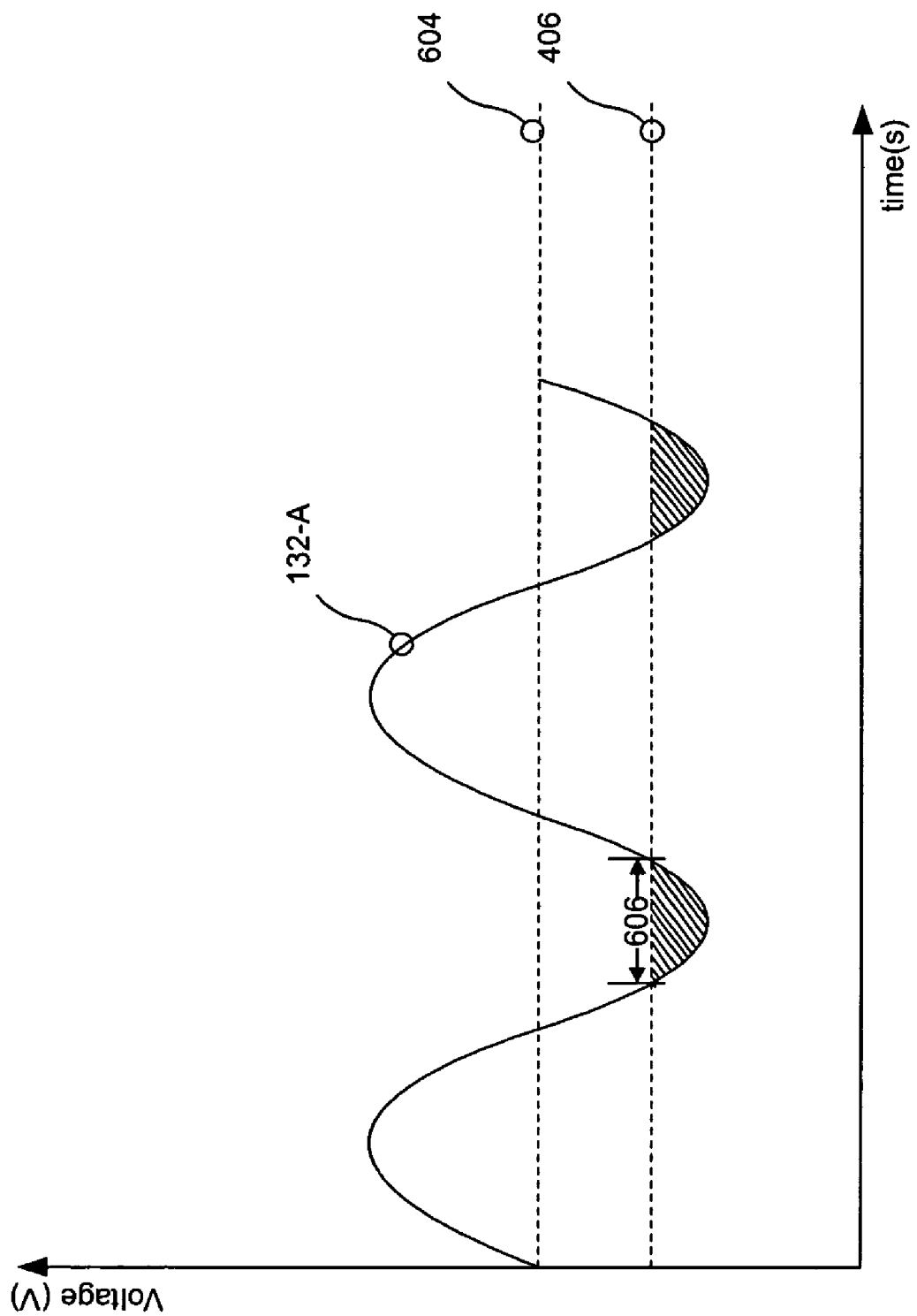
FIG. 6 illustrates the operation of the conventional differential amplifier depicted in FIG. 2 when biased at a third bias point depicted in FIG. 3.

At a bias condition point 306 on the curve 302, the FETs 202-A is biased at a gate-source voltage that is slightly higher than the threshold voltage of the FET 202-A. Specifically, the FET 202-A is not biased with a gate-source voltage that can accommodate the full peak-to-peak voltage swing of the up-converted modulated signal 132-A. FIG. 6 illustrates the behavior of the FET 202-A when biased at a gate-source bias voltage 604 corresponding to the bias point 306. As shown in FIG. 6, the gate-source bias voltage 604 is only slightly higher than the threshold voltage 406 of the FET 202-A. As a result, the up-converted modulated signal 132-A swings below the threshold voltage 406 of the FET 202-A during a portion of the complete cycle of the up-converted modulated signal 132-A. In turn, the FET 202-A is turned off during a portion of the complete cycle of the up-converted modulated signal 132-A. Specifically, the FET 202-A is turned off during a time 606 of the cycle of the up-converted modulated signal 132-A.

Turning off the FET 202-A during the time 606 causes the amplified modulated data signal 122-A to clip, thereby distorting the amplified modulated data signal 122-A. Consequently, the amplified modulated data signal 122-A will comprise a main tone at the frequency of the up-converted modulated signal 132-A. The power of the main tone of the amplified modulated data signal 122-A will be attenuated due to the distortion or clipping. Overall, biasing the FET 202-A at the bias point 306 causes the conventional power amplifier 120 to produce a distorted amplified modulated data signal 122-A.

The conventional power amplifier 200 is considered to be a Class AB amplifier when operated at the bias condition point 306. A Class AB amplifier is characterized as being biased so that an output current flows through less than the entire cycle but more than one-half of the cycle of an input signal. As shown in FIG. 6, the up-converted modulated signal 132-A is above the threshold voltage 406 of the conventional differential amplifier 200 for less than the full cycle but more than one-half of the cycle of the up-converted modulated signal 132-A. When the voltage of the up-converted modulated signal 132-A is lower than the threshold voltage 406, the FET 202-A is cut off. In turn, the drain current of the FET 202-A stops flowing. The conventional power amplifier 200, when operated at the bias condition point 306, distorts the envelope of the amplified modulated data signal 122-A but preserves the zero-crossings of the amplified modulated data signal 122-A.

As previously mentioned, linear modulation schemes that produce variable envelope signals, such as π4/-DQPSK and 8-DPSK, require a linear amplifier for distortionless amplification of a modulated signal. Referring back to FIG. 1, the conventional power amplifier 120 should be a Class A linear amplifier when the conventional modulator 106 implements a linear modulation scheme. For a Bluetooth®-compliant conventional wireless transmitter 100, the conventional power amplifier 120 should be implemented as a Class A amplifier during π4/-DQPSK or 8-DPSK modulation.

Alternatively, non-linear modulation schemes that produce constant envelope signals, such as GFSK, do not require a linear amplifier. That is, a constant envelope signal can tolerate envelope distortion during amplification provided the zero-crossings of the modulated signal are preserved. Therefore, the conventional power amplifier 120 depicted in FIG. 1 does not need to be a Class A linear amplifier when the conventional modulator 106 implements a non-linear modulation scheme. For a Bluetooth®-compliant conventional wireless transmitter 100, the conventional power amplifier 120 does not need to be implemented as a Class A amplifier during GFSK modulation. That is, the conventional power amplifier 120 can be implemented as a Class B or a Class AB amplifier.

The efficiency of a power amplifier is defined as the ratio of the output signal power to the sum of the input signal power and DC input power consumed by the power supply of the power amplifier. Class A amplifiers typically suffer from low efficiency since the DC input power (i.e., the gate-source bias voltage) is required to be large to accommodate the full peak-to-peak voltage swing of an input signal. In turn, the current drain from the power supply of a Class A power amplifier is large. Class AB and Class B amplifiers are typically more efficient than Class A amplifiers since the DC input power of a Class AB or Class B amplifier is much lower. For any given application, it is desirable to use an amplifier with high efficiency in order to reduce the cost of power supplies, cooling equipment and consumed energy. Therefore, to ensure high efficiency, a transmitter capable of dual mode modulation should use a Class A amplifier to amplify modulated signals having variable envelopes and should use something other than a Class A amplifier to amplify modulated signals having constant envelopes.

The conventional wireless transmitter 100 depicted in FIG. 1 is incapable of using a Class A amplifier to amplify modulated signals having variable envelopes and using something other than a Class A amplifier to amplify modulated signals having constant envelopes. The conventional wireless transmitter 100 is restricted to using a single conventional power amplifier 120 for each modulation scheme implemented by the conventional modulator 106. For a conventional wireless transmitter 100 operating according to the Bluetooth® standard, this inflexibility translates into wasted power and higher operating costs as the conventional modulator 106 toggles between 8-DPSK, GFSK and π4/-DQPSK.

The conventional wireless transmitter 100 can implement the conventional power amplifier 120 as a Class A amplifier during all modes of modulation. This, however, results in wasted power during non-linear modulation modes since non-linear modulated signals can tolerate a lower-biased power amplifier. For a Bluetooth®-compliant conventional wireless transmitter 100, implementing the conventional power amplifier 120 as a Class A amplifier wastes power during GFSK modulation.

The conventional wireless transmitter 100 can alternatively implement the conventional power amplifier 120 as something other than a Class A amplifier during all modes of modulation. This, however, will result in distortion of the amplified modulated data signals 122-A and 122-B during linear modulation modes. For the Bluetooth®-compliant conventional wireless transmitter 100, implementing the conventional power amplifier 120 as something other than a Class A amplifier will result in the distortion of the amplified modulated data signal 122-A and 122-B during 8-DPSK and π4/-DQPSK modulation.

The conventional wireless transmitter 100 can use several different power amplifiers to amplify up-converted modulated signals 132-A and 132-B based on the mode of modulation implemented by the conventional modulator 106. The implementation of several different power amplifiers, however, increases the space needed on a semiconductor chip for the power amplifiers and increases integration costs and operating costs. Therefore, it is desirable to have a power amplifier that is efficient across all modes of modulation implemented by a modulator. For a Bluetooth®-compliant conventional wireless transmitter 100 specifically, it is desirable for the conventional power amplifier 120 to operate as a Class A amplifier during 8-DPSK and π4/-DQPSK modulation and to operate as something less than a Class A amplifier (e.g., a Class AB or Class B amplifier) during GFSK modulation.

Figure 7:
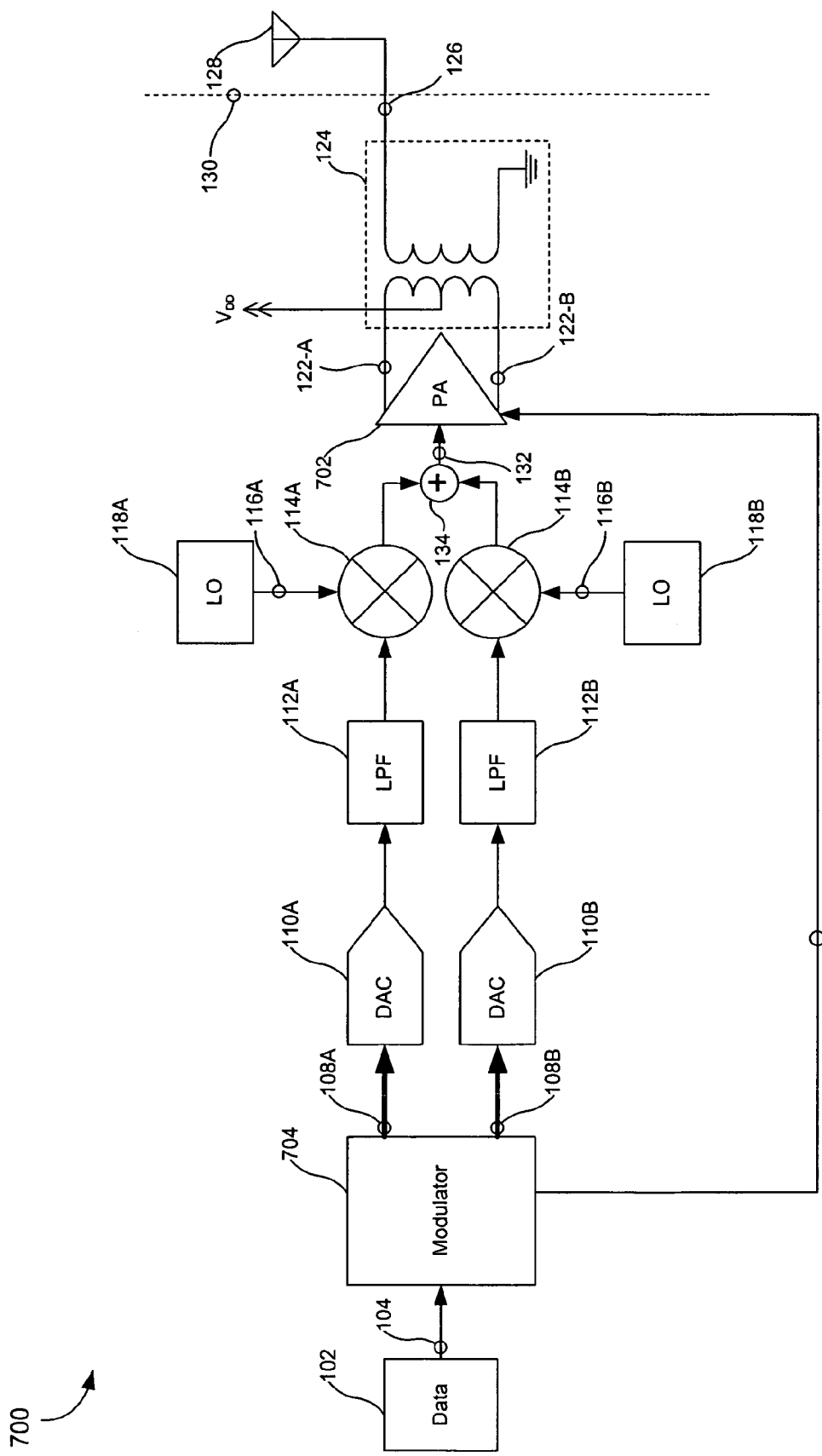
FIG. 7 illustrates a wireless transmitter having a single power amplifier to maintain a constant output power that is efficient across all modes of modulation according to the present invention.

FIG. 7 illustrates a wireless transmitter 700 that includes a single power amplifier 702 that is efficient across all modes of modulation, according to the present invention. Specifically, the biasing of the power amplifier 702 is adjusted during operation according to the modulation scheme implemented by a modulator 704. A feed-forward connection 706 is used to indicate a change in modulation scheme by the modulator 704 to the power amplifier 702.

The power amplifier 702 is biased at a relatively high level when the modulator 704 implements a linear modulation scheme that produces modulated data signals 108-A and 108-B having variable envelopes. The power amplifier 702 is biased at a relatively low level when the modulator 704 implements a non-linear modulation scheme that produces modulated data signals 108-A and 108-B having constant envelopes. The wireless transmitter 700, when operating according to the Bluetooth® protocol, biases the power amplifier 702 at a relatively high level for 8-DPSK and π4/-DQPSK modulation and biases the power amplifier 702 at a relatively low level for GFSK modulation. By tuning the bias of the power amplifier 702 according to the mode of modulation implemented by the modulator 704, the wireless transmitter 700 reduces the power consumed by the power amplifier 702 at times when the power amplifier 702 does not need to provide linear amplification.

Figure 8:
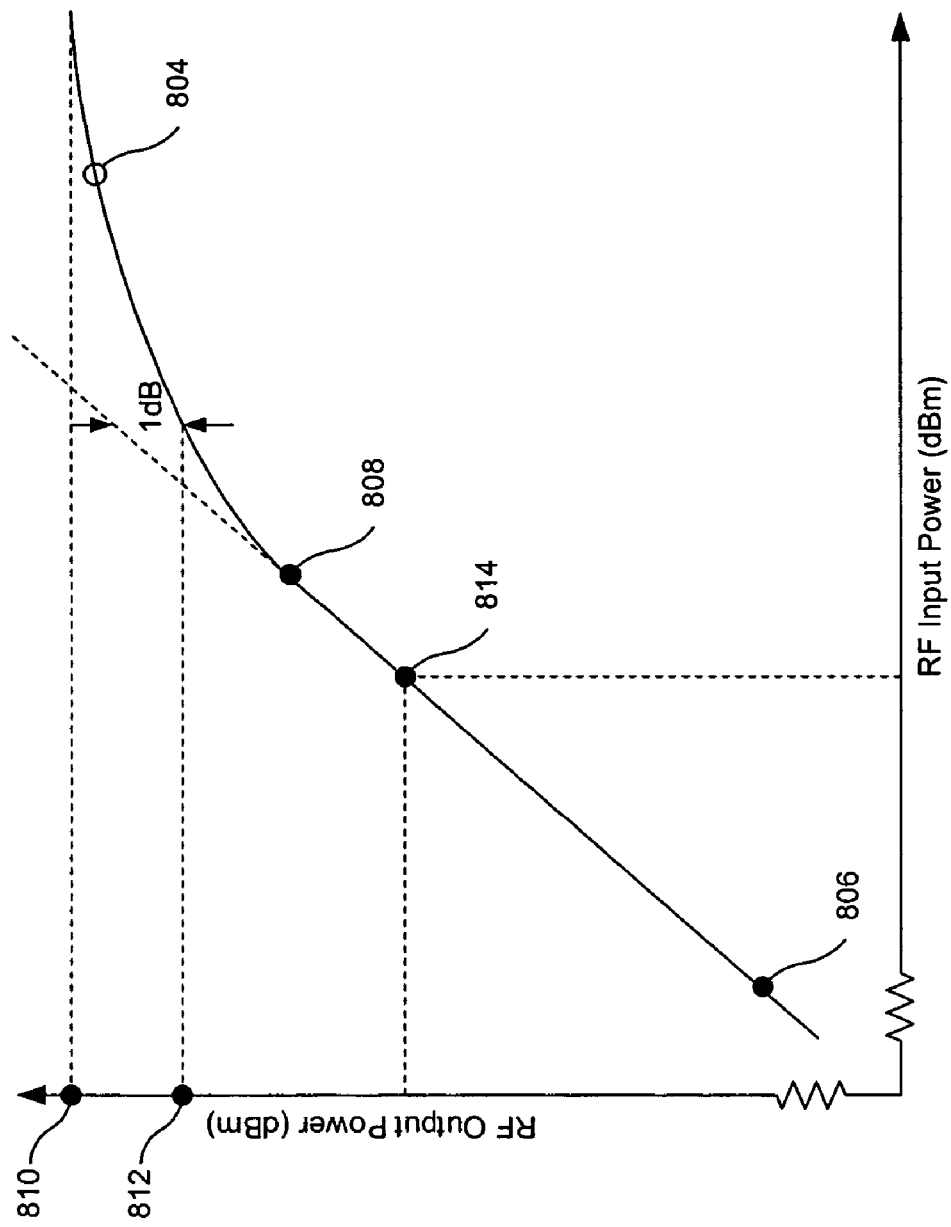
FIG. 8 illustrates a first output characteristic of the power amplifier of the present invention depicted in FIG. 7.

FIG. 8 illustrates an output characteristic of the power amplifier 702 for a given biasing condition. The output characteristic of the power amplifier 702 is used to determine or set an operating point (i.e., output power) of the power amplifier 702. The output characteristic of the power amplifier 702 compares the RF output power of the power amplifier 702 to the RF input power of the power amplifier 702. The output characteristic of the power amplifier 702 therefore illustrates the gain of the power amplifier 702 over a range of RF input powers. The RF input power of the power amplifier 702 is the power of up-converted modulated signals 132-A and 132-B that are provided to the power amplifier 702. The RF output power of the power amplifier 702 is the power of the amplified modulated data signals 122-A and 122-B provided by the power amplifier 702. An output characteristic curve 804 depicts the relationship between the RF input power and the RF output power of the power amplifier 702.

As shown in FIG. 8, the RF output power linearly tracks the RF input power over a broad range of RF input powers. Specifically, the power amplifier 702 operates as a linear amplifier with a constant gain for the range of RF input powers between a point 806 and a point 808 on the output characteristic curve 804. As the RF input power is increased past the point 808, the RF output power no longer linearly tracks the RF input power. The RF input power increases at a lower rate until the RF output power reaches a saturation output power level 810. The point at which the RF output power deviates by 1 dB from the expected RF output power is considered the 1 dB compression point of the power amplifier 702. The 1 dB compression point of the power amplifier 702 is denoted by a point 812.

To ensure linear amplification of the up-converted modulated signals 132-A and 132-B, the power amplifier 702 is operated at an operating point 814. The operating point 814 is chosen to be below the 1 dB compression point 812 of the power amplifier 702 and within the linear region of operation (between the points 806 and 808) of the power amplifier 702. The operating point 814 of the power amplifier is "backed off" from the 1 dB compression point 812 so as to accommodate the full peak-to-peak voltage swing of the up-converted modulated signals 132-A and 132-B. A large voltage swing on up-converted modulated signals 132-A and 132-B could force the power amplifier 702 into a non-linear region of operation if the operating point 814 is chosen too close to the 1 dB compression point 812.

Figure 9:
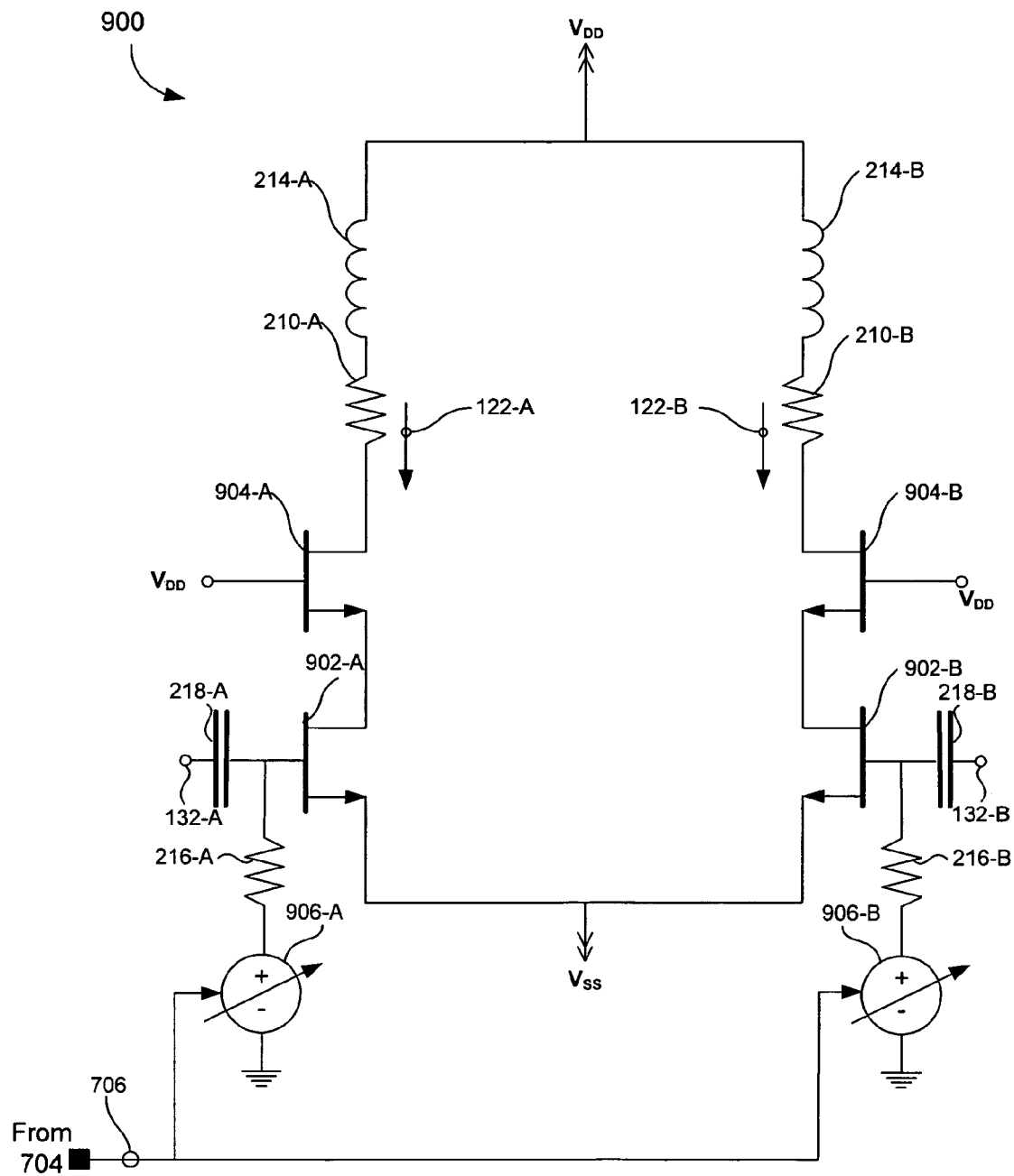
FIG. 9 illustrates a differential amplifier of the present invention as an embodiment of the power amplifier depicted in FIG. 7.

FIG. 9 illustrates a differential amplifier 900 as an embodiment of the power amplifier 702. The differential amplifier 702 includes a first pair of transistors 902-A and 902-B. The first pair of transistors 902-A and 902-B are each FETs. The sources of the FETs 902-A and 902-B are connected together and coupled to $V_{SS}$.

The gates of the FETs 902-A and 902-B are AC coupled to the up-converted modulated signals 132-A and 132-B through capacitors 218-A and 218-B, respectively. The gates of the FETs 902-A and 902-B are DC coupled to variable voltage sources 906-A and 906-B through bias resistors 216-A and 216-B, respectively. The variable voltage sources 906-A and 906-B, in conjunction with the bias resistors 216-A and 216-B, are used to bias the FETs 902-A and 902-B by applying a desired gate-source voltage to the FETs 902-A and 902-B, respectively. The variable voltage sources 906-A and 906-B are tuned or controlled by the modulator 704 (not shown in FIG. 9) by the feed-forward connection 706 depicted in FIG. 7. A change in modulation scheme by the modulator 704 causes the feed-forward connection 706 to adjust the gate-source bias voltages provided by the variable voltage sources 906-A and 906-B. The feed-forward connection 706 is used to adjust the gate-source voltages of the FETs 902-A and 902-B to an appropriate level based on the modulation scheme implemented by the modulator 704.

As further shown in FIG. 9, the drains of the FETs 902-A and 902-B are coupled to the sources of a second pair of transistors 904-A and 904-B, respectively. The transistors 904-A and 904-B are also FETs. The drains of the FETs 904-A and 904-B are coupled to resistors 210-A and 210-B and to inductors 214-A and 214-B, respectively. The drains of the FETs 904-A and 904-B are also coupled to the voltage supply $V_{DD}$. The FETs 904-A and 904-B operate as switches within the differential amplifier 900. Specifically, the FETs 904-A and 904-B are turned on by applying $V_{DD}$ to the gates of the FETs 904-A and 904-B. The FETs 904-A and 904-B can be used to turn on and to turn off the output of the power amplifier 702.

The biasing of the FETs 902-A and 902-B can be set to ensure linear operation of the differential amplifier 900 based on the characteristics of the wireless transmitter 700 (e.g., the number of primary and secondary winding of the transformer 124, the resistive load of the off-chip antenna 128, the power loss of the transformer 124, the supply voltage $V_{DD}$, the required peak-to-peak voltage swing of the up-converted modulated signals 132-A and 132-B, etc.). Specifically, the differential amplifier 900 can be biased to operate at the operating point 814 depicted in FIG. 8 when linear amplification of up-converted modulated signals 132-A and 132-B is required. The differential amplifier 900 is biased to operate at operating point 814 by setting the gate-source bias voltages provided by the variable voltage sources 906-A and 906-B to an appropriate level. For the Bluetooth®-compliant wireless transmitter 700, the differential amplifier 900 operates at operating point 814 when the modulator 704 implements 8-DPSK or π4/-DQPSK modulation.

The biasing of the differential amplifier 900 is adjusted when linear amplification of up-converted modulated signals 132-A and 132-B is not required. Specifically, the gate-source bias voltages provided by the variable voltage sources 906-A and 906-B are lowered when linear amplification is not needed. The modulator 704 provides an indication to the power amplifier 702 when the modulator 704 switches to a mode of modulation that produces a constant envelope signal. In response, the power amplifier 702 adjusts the biasing of the differential amplifier 900 by lowering the voltages applied to the gates of the FETs 904-A and 904-B. For the Bluetooth®-compliant wireless transmitter 700, the differential amplifier 900 lowers the biasing of the differential amplifier when the modulator 704 implements GFSK modulation.

Figure 10:
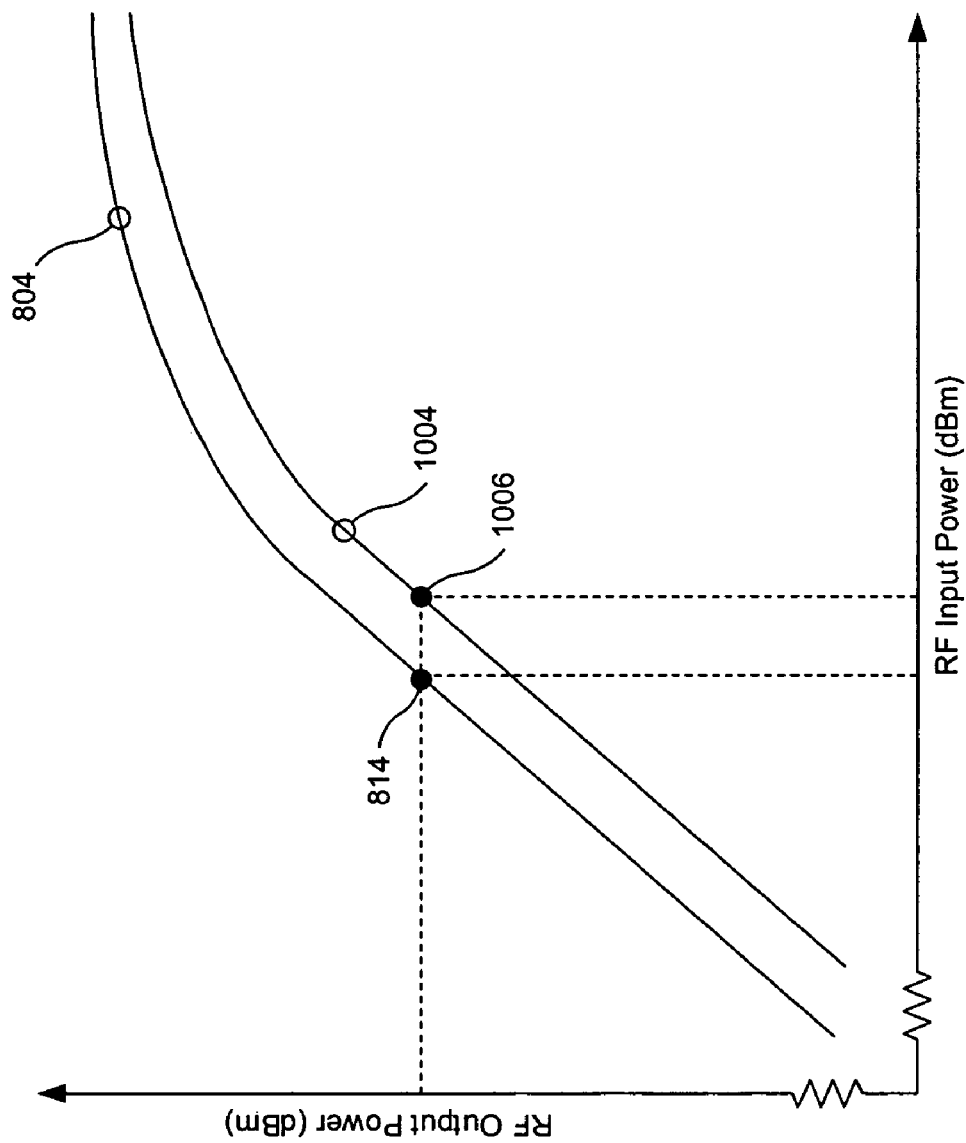
FIG. 10 illustrates a second output characteristic of the power amplifier of the present invention in comparison to the first output characteristic depicted in FIG. 8.

FIG. 10 illustrates the effect of lowering the gate-source bias voltages of the power amplifier 702. FIG. 10 compares the output characteristic curve 804 illustrated in FIG. 8 to an output characteristic curve 1004. The output characteristic curve 1004 represents the output characteristic of the power amplifier 702 under relatively low bias. As shown in FIG. 10, lowering the bias of the power amplifier 702 shifts the output characteristic of the power amplifier 702 from the output characteristic curve 804 to the output characteristic curve 1004. In essence, the gain of the power amplifier is lowered. A higher RF input power is therefore required during a lowered bias condition to maintain the same RF output power provided during an elevated bias condition. That is, under relatively low bias conditions, the RF input power of the power amplifier 702 must be increased in order to maintain operation at the operating point 814 of the output characteristic curve 804 to compensate for the decreased gain of the power amplifier 702.

Referring back to FIG. 7, the wireless transmitter 700 adjusts the power level of up-converted modulated signals 132-A and 132-B when the modulator 704 implements a modulation scheme that does not require linear modulation. Specifically, the modulator 704 increases the power of up-converted modulated signals 132-A and 132-B to compensate for a decrease in the biasing of the power amplifier 702. The power of up-converted modulated signals 132-A and 132-B is increased by an amount corresponding to the change in the gain of the power amplifier 702. Essentially, the power amplifier 702 is driven harder such that the power amplifier 702 operates at an operating point 1006 on the curve 1004 of FIG. 10. As shown in FIG. 10, the operating point 1006 is equivalent to the operating point 814. As a result, the power amplifier 702 provides the same output power level across all modes of modulation.

Adjustment of the bias of the power amplifier 702 provided by the present invention increases the efficiency of the wireless transmitter 700. The present invention enables the power amplifier 702 to be tuned to an efficient biasing level for each modulation scheme. Without the ability to adjust the biasing of the power amplifier 702 afforded by the present invention, the biasing level of a power amplifier is fixed across multiple modulation schemes, thereby wasting power. By conserving energy, the battery life of a mobile incorporating the wireless transmitter 700 is extended. The present invention also minimizes the on-chip space of the power amplifier 702 by rendering the need for multiple power amplifiers, corresponding to different modulation schemes, obsolete.

FIG. 11 provides a flowchart 1100 that illustrates operational steps corresponding to FIG. 7 for adjusting the bias of a power amplifier in response to a change in modulation scheme, according to the present invention. The invention is not limited to this operational description. Rather, it will be apparent to persons skilled in the relevant art(s) from the teachings herein that other operational control flows are within the scope and spirit of the present invention. In the following discussion, the steps in FIG. 11 are described.

At step 1102, the 1 dB compression point of a power amplifier is determined.

At step 1104, the operating point of the power amplifier is set lower than the 1 dB compression point of the power amplifier. The operating point of the power amplifier is selected to be within a linear region of operation of the power amplifier. The operating point is chosen to accommodate the full peak-to-peak voltage swing of an input signal and to provide distortionless amplification of the input signal.

At step 1106, a data signal comprising a sequence of bits is received by a modulator.

At step 1108, a mode of modulation to be implemented by the modulator is determined. The mode of modulation can be user-specified or automatically determined. The modulation scheme implemented by the modulator is either a linear or a non-linear modulation scheme.

At step 1110, the data signal is modulated by the modulator to produce a modulated data signal. The modulated data signal requires linear amplification if the modulated data signal has a variable envelope. The modulated data does not require linear amplification if the modulated data signal has a constant envelope.

At step 1112, the biasing of the power amplifier is adjusted based on the mode of modulation. The power amplifier is biased for linear amplification when the modulator implements a linear modulation scheme. The power amplifier is not biased for linear amplification when the modulator implements a non-linear modulation scheme. Specifically, the biasing of the power amplifier is lowered when the modulator implements a non-linear modulation scheme. Accordingly, the gain of the power amplifier is decreased during non-linear modulation. The operating point of the power amplifier remains substantially constant across different modes of modulation by increasing the power of modulated data signal during non-linear modulation. That is, the power of the modulated data signal is increased by an amount corresponding to the decrease in gain of the power amplifier caused by the decreased bias of the power amplifier.

At step 1114, the modulated data signal is amplified by the power amplifier to produce an amplified modulated data signal.

At step 1116, the mode of modulation is monitored. A change in the modulation scheme implemented by the modulator results in an adjustment of the biasing of the power amplifier. Specifically, the power amplifier is biased at a relatively high level for linear modulation and at a relatively low level for non-linear modulation.

CONCLUSION

While various embodiments of the present invention have been described above, it should be understood that they have been presented by way of example and not limitation. It will be apparent to one skilled in the pertinent art that various changes in form and detail can be made therein without departing from the spirit and scope of the invention. Therefore, the present invention should only be defined in accordance with the following claims and their equivalents.

What is claimed is:

1. A transmitter, comprising:
    a modulator to produce a modulated signal from a data signal; wherein the modulator produces a variable envelope modulated signal during a first mode and produces a constant envelope modulated signal during a second mode; and
    an amplifier having a pair of differential transistors coupled to the modulator to produce an amplified modulated signal;
    wherein a first voltage biases the amplifier during the first mode so that said differential transistor pair is turned on during a substantially complete cycle of the variable envelope modulated signal, and a second voltage biases the amplifier during a second mode so that said differential transistor pair is turned off during a portion of a complete cycle of the constant envelope modulated signal.

2. The transmitter of claim 1, wherein the first voltage is greater than the second voltage.

3. The transmitter of claim 2, wherein the amplifier is a linear amplifier during the first mode of the modulator and is a non-linear amplifier during the second mode of the modulator.

4. The transmitter of claim 2, wherein a gain of the amplifier during the first mode of the modulator is greater than the gain of the amplifier during the second mode of the modulator.

5. The transmitter of claim 4, wherein a power of the constant envelope modulated signal is increased by an amount approximately equal to a difference in the gain of the amplifier between the first and second modes of the modulator.

6. The transmitter of claim 1, wherein the pair of differential transistors are Field-Effect Transistors (FETs).

7. The transmitter of claim 1, wherein the power of the amplified modulated signal is based on a maximum power level of the amplifier when biased with the first voltage.

8. The transmitter of claim 7, wherein the power of the amplified modulated signal is less than the maximum power level of the amplifier.

9. The transmitter of claim 7, wherein the maximum power level of the amplifier is a 1 dB compression point of the amplifier.

10. A method, comprising:
    (1) determining a mode of modulation for a modulator, wherein the mode of modulation is a linear mode of modulation or a non-linear mode of modulation;
    (2) modulating a data signal with the modulator to produce a modulated signal;
    (3) biasing an amplifier based on the mode of modulation, wherein the amplifier is biased for linear amplification during linear modulation and is biased for non-linear amplification during non-linear modulation; and
    (4) amplifying the modulated signal with the amplifier to produce an amplified modulated signal;
    wherein an operating point of the amplifier remains substantially constant during linear and non-linear modulation, and wherein a gain is lowered for non-linear operation relative to linear operation.

11. The method of claim 10, further comprising:
    (5) selecting the operating point of the amplifier prior to step (3).

12. The method of claim 11, wherein step (5) comprises:
    (a) determining a 1 dB compression point of the amplifier.

13. The method of claim 12, wherein step (5) further comprises:
    (b) setting the operating point of the amplifier to be less than the 1 dB compression point of the amplifier.

14. The method of claim 10, wherein step (2) comprises:
    producing a variable envelope modulated signal during the linear mode of modulation; and
    producing a constant envelope modulated signal during the non-linear mode of modulation.

15. The method of claim 14, wherein step (3) comprises:
    (a) biasing the amplifier as a Class A amplifier during the linear mode of modulation.

16. The method of claim 14, wherein step (3) comprises:
    (a) biasing the amplifier as less than a Class A amplifier during the non-linear mode of modulation.

17. The method of claim 16, wherein step (3) further comprises:
    (b) increasing a power of the constant envelope modulated signal such that a power of the amplified modulated signal remains substantially constant during the linear and non-linear modes of modulation.

18. A transmitter, comprising:
    an amplifier to amplify a modulated signal;
    wherein a first voltage biases the amplifier when the modulated signal is a variable envelope modulated signal and a second voltage biases the amplifier when the modulated signal is a constant envelope modulated signal; and
    said amplifier biased by said first and second voltages to lower the gain for the constant envelope signal relative to the variable envelope signal, but maintain a constant operating point for the amplifier.

* * * * *